US009332627B2

(12) United States Patent (10) Patent No.: US 9,332,627 B2
Hung et al. (45) Date of Patent: May 3, 2016

(54) THERMAL DISSIPATING MODULE

(71) Applicants: Jia-Yu Hung, Taipei (TW); Chang-Yuan Wu, Taipei (TW); I-Feng Hsu, Taipei (TW); Ting-Wei Hsu, Taipei (TW)

(72) Inventors: Jia-Yu Hung, Taipei (TW); Chang-Yuan Wu, Taipei (TW); I-Feng Hsu, Taipei (TW); Ting-Wei Hsu, Taipei (TW)

(73) Assignee: COMPAL ELECTRONICS, INC., Taipei (TW)

( * ) Notice: Subject to any disclaimer, the term of this patent is extended or adjusted under 35 U.S.C. 154(b) by 270 days.

(21) Appl. No.: 13/958,628

(22) Filed: Aug. 5, 2013

(65) Prior Publication Data

US 2014/0071630 A1 Mar. 13, 2014

(30) Foreign Application Priority Data

Sep. 7, 2012 (TW) .............................. 101132858 A (51) Int. Cl.
*H05K 7/20* (2006.01)
*H05K 1/02* (2006.01)
*H01L 23/367* (2006.01)
(Continued)

(52) U.S. Cl.
CPC ............ *H05K 1/0203* (2013.01); *H01L 23/367* (2013.01); *H05K 1/0209* (2013.01); *H01L 23/40* (2013.01); *H01L 23/4006* (2013.01); *H01L 23/427* (2013.01); *H01L 2924/0002* (2013.01); *H05K 2201/10393* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ........................ 361/676–678, 679.46–679.54, 361/688–723; 165/80.1–80.5, 104.33, 185; 174/15.1–15.3, 16.1–16.3, 547, 548; 257/712–722, E23.088; 24/453, 24/458–459; 454/184; 312/236
See application file for complete search history.

(56) References Cited

U.S. PATENT DOCUMENTS 6,185,100 B1 * 2/2001 Bentz ................... H05K 7/2049
165/185
6,992,893 B2 * 1/2006 Miyamura .......... H01L 23/4093
165/80.3

(Continued)

FOREIGN PATENT DOCUMENTS

CN 102215658 10/2011
TW 526942 4/2003

(Continued)

OTHER PUBLICATIONS

"Office Action of Taiwan Counterpart Application", issued on Jun. 11, 2014, p. 1-11, in which the listed references were cited.

*Primary Examiner* — Anthony Haughton
*Assistant Examiner* — Razmeen Gafur
(74) *Attorney, Agent, or Firm* — Jianq Chyun IP Office (57) ABSTRACT

A thermal dissipating module suitable for removing heat from a heating element disposed on a circuit board is provided. The thermal dissipating module includes a heat conductive structure, an adhesive layer and an elastic member. The heat conductive structure is suitable for being disposed on the heating element. The adhesive layer is suitable for being disposed on the circuit board and adjacent to the heating element. The elastic member is glued to the circuit board by the adhesive layer, and the elastic member applies a force to make the heat conductive structure to be attached to the heating element.

15 Claims, 10 Drawing Sheets

(51) Int. Cl.
  *H01L 23/473* (2006.01)
  *H01L 23/40* (2006.01)
  *H01L 23/427* (2006.01)

(56) References Cited

U.S. PATENT DOCUMENTS

| | | | | |
|---|---|---|---|---|
| 2003/0103331 A1* | 6/2003 | Lee | H01L 23/4093 | 361/703 |
| 2004/0212963 A1* | 10/2004 | Unrein | H01L 23/4006 | 361/704 |
| 2005/0111195 A1* | 5/2005 | Wu | H01L 23/433 | 361/705 |
| 2005/0128713 A1* | 6/2005 | Schmidberger | H01L 23/4006 | 361/719 |
| 2005/0180113 A1* | 8/2005 | Shirakami | H01L 23/373 | 361/704 |
| 2006/0139887 A1* | 6/2006 | Kameda | H01L 23/427 | 361/704 |
| 2007/0041160 A1* | 2/2007 | Kehret | H05K 7/20445 | 361/704 |
| 2007/0159799 A1* | 7/2007 | Dando et al. | H01L 23/373 | 361/709 |
| 2007/0242439 A1* | 10/2007 | Lu | H01L 23/4006 | 361/719 |
| 2009/0168358 A1* | 7/2009 | Koike | H05K 7/209 | 361/709 |
| 2009/0168360 A1* | 7/2009 | Negrut | H01L 23/4006 | 361/710 |
| 2010/0027220 A1* | 2/2010 | Hughes | H05K 7/20445 | 361/702 |
| 2010/0053897 A1* | 3/2010 | Kusaka | G06F 1/203 | 361/697 |
| 2010/0091460 A1* | 4/2010 | Hinze | H01L 23/367 | 361/709 |
| 2010/0103604 A1* | 4/2010 | Jafari | G06F 1/183 | 361/679.31 |
| 2010/0142155 A1* | 6/2010 | Mertol | H01L 23/055 | 361/719 |
| 2010/0315787 A1* | 12/2010 | Li | H01L 23/3677 | 361/709 |
| 2011/0002102 A1* | 1/2011 | Brok | H01L 23/467 | 361/701 |
| 2011/0116238 A1* | 5/2011 | Huang | H01L 23/36 | 361/709 |
| 2011/0222237 A1* | 9/2011 | Fujiwara | G06F 1/203 | 361/679.48 |
| 2011/0249406 A1* | 10/2011 | Andrews | F21V 29/004 | 361/704 |
| 2011/0292614 A1* | 12/2011 | Horng | H01L 23/3677 | 361/720 |
| 2011/0304991 A1* | 12/2011 | Huang | B82Y 10/00 | 361/719 |

FOREIGN PATENT DOCUMENTS

| | | |
|---|---|---|
| TW | 200826823 | 6/2008 |
| TW | 201118545 | 6/2011 |

* cited by examiner

THERMAL DISSIPATING MODULE

CROSS-REFERENCE TO RELATED APPLICATION

This application claims the priority benefit of Taiwan application serial no. 101132858, filed on Sep. 7, 2012. The entirety of the above-mentioned patent application is hereby incorporated by reference herein and made a part of this specification.

BACKGROUND OF THE INVENTION

1. Field of the Invention

The invention relates to a thermal dissipating module, and more particularly to a thermal dissipating module for an electronic apparatus.

2. Description of Related Art

With dramatic progress in technology development in recent years, the working speed of computers has increased. Moreover, the heat from heating elements in the computer main unit has also increased. In order to prevent the computer main unit from being temporarily or permanently malfunctioned due to overheat, it has become very important to dissipate the heat from the heating elements in the computer.

Take a central processing unit (CPU) as an example. Under the circumstances where the CPU is working at a high speed, when a temperature of the CPU is higher than a normal working temperature, the CPU is very likely to have operation errors or to be temporarily malfunctioned, causing the computer main unit to crash. In addition, when the temperature of the CPU is far higher than the normal working temperature, even a transistor in the CPU is very likely to be damaged, causing the CPU to be permanently malfunctioned.

Currently, a common method of dissipating the heat is to dispose a thermal dissipating module on the heating element for dissipating the heat to lower the temperature of the heating element. The thermal dissipating module is usually secured on the heating element by screw thread. However, the method requires a hole to be made on a circuit board at a position corresponding to a screw, which not only restricts the design of the circuit board but also takes a lot of time and processes to assemble and disassemble the thermal dissipating module.

SUMMARY OF THE INVENTION

The invention provides a thermal dissipating module for removing heat from a heating element disposed on a circuit board.

The invention provides a thermal dissipating module which includes a heat conductive structure, an adhesive layer, and an elastic member. The heat conductive structure is suitable for being disposed on the heating element. The adhesive layer is suitable for being disposed on the circuit board and is adjacent to the heating element. The elastic member is glued to the circuit board by the adhesive layer, and the elastic member applies a force to make the heat conductive structure attach to the heating element. The elastic member includes a main body and an extension arm, wherein the main body is suitable for being glued to the circuit board by the adhesive layer. The extension arm has a first end part and a second end part. The first end part is connected to the main body, and the second end part is secured to the heat conductive structure so as to provide a force which is toward the heating element to the heat conductive structure to make the heat conductive structure attach to the heating element.

In an embodiment of the invention, the force may be applied to the main body for which to detach from the adhesive layer.

Based on the above, the invention allows the elastic member to be detachably glued to the circuit board by the adhesive layer and is secured to the heat conductive structure via the elastic member, which simplifies an assembling process of the thermal dissipating module. Therefore, the invention does not require a hole to be made on the circuit board to secure the thermal dissipating module, thereby reducing the number of perforated holes on the circuit board to allow a more flexible design of the circuit board.

In order to make the aforementioned features and advantages of the invention more comprehensible, embodiments accompanying figures are described in detail below.

DESCRIPTION OF EMBODIMENTS

Figure 1A:
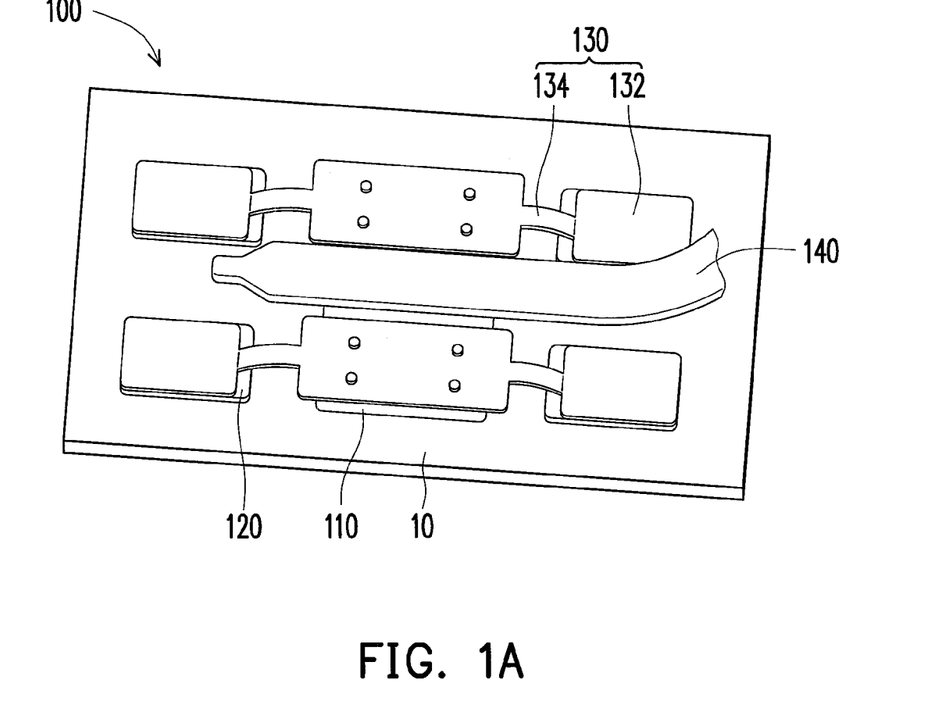
FIG. 1A is a perspective view of a thermal dissipating module disposed on a circuit board according to a first embodiment of the invention.
Figure 1B:
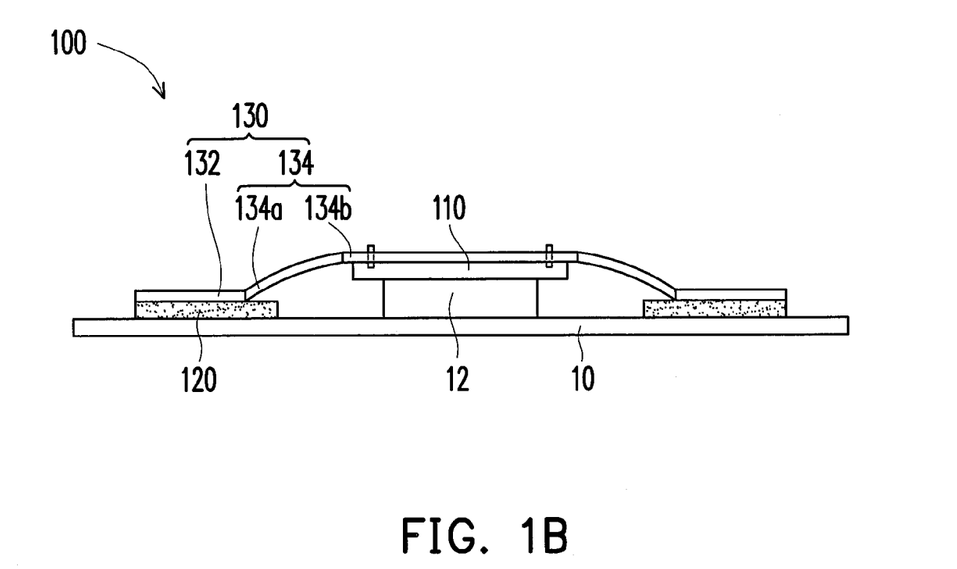
FIG. 1B is a front view of the thermal dissipating module in FIG. 1A.

FIG. 1A is a perspective view of a thermal dissipating module disposed on a circuit board according to a first embodiment of the invention. FIG. 1B is a front view of the thermal dissipating module in FIG. 1A. Please refer to FIGS. 1A and 1B. A thermal dissipating module 100 in the embodiment is suitable for removing heat from a heating element 12 disposed on a circuit board 10. The heating element 12 is, for example, a central processing unit (CPU), a memory module, a graphics processing unit (GPU), or a chipset.

The thermal dissipating module 100 includes a heat conductive structure 110, at least one adhesive layer 120, and at least one elastic member 130. The heat conductive structure 110 is suitable for being disposed on the heating element 12. A material of the heat conductive structure 110 may be copper or other metals easily transferring heat. By making the heat conductive structure 110 attach tightly to the heating element 12, the heat from the heating element 12 may be removed to lower a temperature of the heating element 12. In addition, in the embodiment, the thermal dissipating module 100 has four adhesive layers 120 and four elastic members 130. Two adhesive layers 120 and two elastic members 130 as a set are disposed on two relative sides of the heating element 12. The two adhesive layers 120 of each set are disposed on the circuit board 10 and symmetrically on two sides of the heating element 12. Each elastic member 130 includes a main body 132 and an extension arm 134. The main body 132 is suitable for being glued to the circuit board 10 by the adhesive layer 120.

As shown in FIG. 1B, the extension arm 134 of the elastic member 130 has a first end part 134a and a second end part 134b. The first end part 134a is connected to the main body 132 and the second end part 134b is secured on the heat conductive structure 110. In the embodiment, the second end part 134b of the extension arm 134 of the two elastic members 130 of each set is connected. However, in other embodiments, the second end part 134b of the extension arm 134 of the two elastic members 130 of each set may not be connected. In addition, the two elastic members 130 of each set may be symmetrically disposed on an external side of the heat conductive structure 110 and provides a force which is toward the heating element 12 to the heat conductive structure 110 to make the heat conductive structure 110 attach to the heating element 12.

In the embodiment, the main body 132 and the extension arm 134 are integrally formed. Moreover, the second end part 134b of the extension arm 134 is secured on the heat conductive structure 110 by perforation pins. However, in other embodiments, the first end part of the extension arm may be connected to the main body by locking, welding, or adhering. Furthermore, the second end part of the extension arm may be connected to the heat conductive structure by welding, adhering, or integral formation.

The adhesive layer 120 in the embodiment has a removal characteristic which is similar to or the same as that of a damage-free adhesive strip on the market, and therefore the thermal dissipating module 100 may be quickly assembled on or dissembled from the circuit board 10. When a normal force is applied to the adhesive layer 120, the adhesive layer 120 has great stickiness so that the thermal dissipating module 100 does not fall off the circuit board 10 easily. When a shear force is applied to the adhesive layer 120, the stickiness of the adhesive layer 120 is destroyed so that the thermal dissipating module 100 is able to fall off the circuit board 10 easily. When a certain degree of force is applied to the main body 132, an adhesive force between the circuit board 10 and the main body 132 may be eliminated so that the main body 132 may separate from the circuit board 10, wherein the certain degree of force is usually a shear force applied to a surface of the adhesive layer 120.

Please refer to FIG. 1A again. The thermal dissipating module 100 in the embodiment may further include a heat pipe 140. The heat pipe 140 is connected to the heat conductive structure 110 so that the heat energy generated by the heating element 12 is transmitted to the heat pipe 140 through heat conductive structure 110. Cooling fluid (such as coolant or water) may flow through in the heat pipe 140 to provide a higher dissipating efficiency to the heating element 12.

The main body 132 of the thermal dissipating module 100 in the embodiment is secured on the circuit board 10 by the adhesive layer 120 and is connected to the heat conductive structure 110 via the extension arm 134 to make the heat conductive structure 110 attach to the heating element 12 to ensure sufficient heat dissipating capability, wherein the heat conductive structure 110 is a heat dissipating fin which may consist of metal. Therefore, it is not required to use a conventional technique such as forming a hole on the circuit board 10 to secure the thermal dissipating module 100 with screws, which may reduce the number of holes on the circuit board 10 and increase design flexibility of the circuit board 10. In addition, since the force can be applied to the main body 132 for which to detach from the adhesive layer 120, it is easier to assemble or disassemble the thermal dissipating module 100.

Additionally, when the thermal dissipating module is disposed on the circuit board, the elastic member provides a force which is toward the heating element to the heat conductive structure which also generates a reactive force to the elastic member. In order to reduce the impact of the reactive force from the heat conductive structure brought to the elastic member for the main body to be glued to the circuit board more stably, the following paragraphs provide a variety of shapes of the elastic member for strengthening the coherency between the main body as well as the adhesive layer of the elastic member and the circuit board.

Figure 2A:
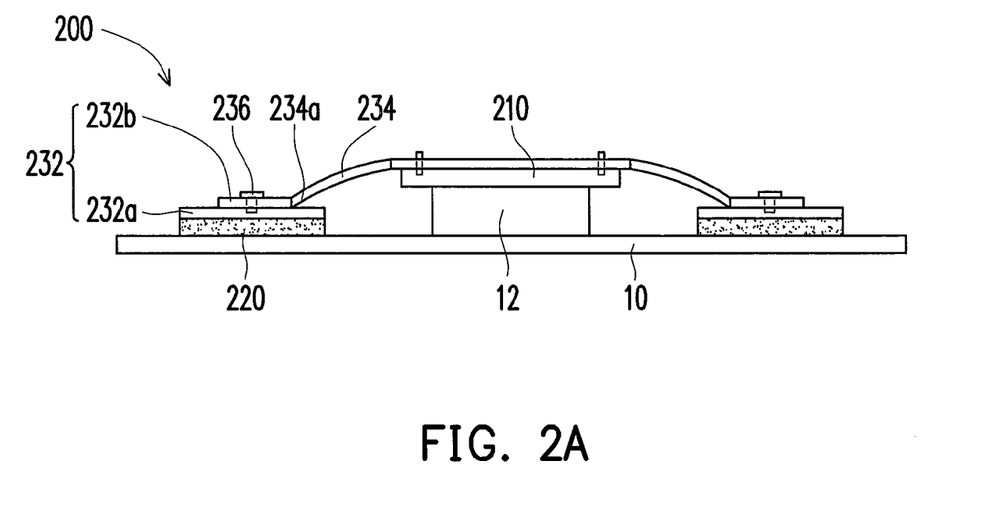
FIG. 2A is a front view of a thermal dissipating module disposed on a circuit board according to a second embodiment of the invention.
Figure 2B:
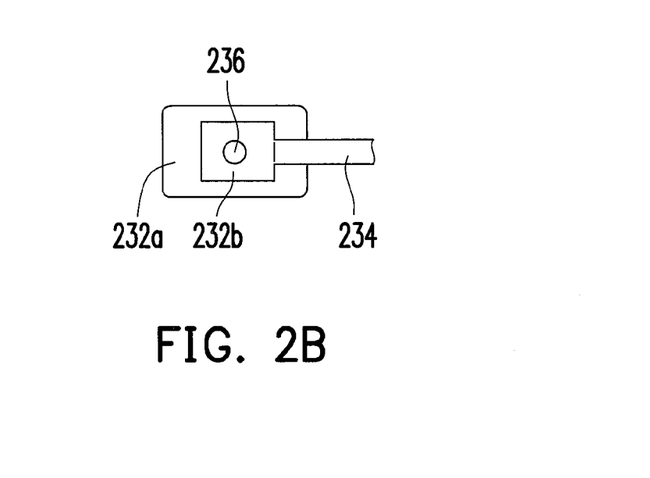
FIG. 2B is a top view of the thermal dissipating module in FIG. 2A.

FIG. 2A is a front view of a thermal dissipating module disposed on a circuit board according to a second embodiment of the invention. FIG. 2B is a top view of the thermal dissipating module in FIG. 2A. Please refer to FIGS. 2A and 2B. A main body 232 of a thermal dissipating module 200 includes a flat plate 232a and a fixing plate 232b. The flat plate 232a is suitable for being glued to the circuit board 10 by an adhesive layer 220, and the fixing plate 232b is screwed to the flat plate 232a through a screw 236 as well as is connected to a first end part 234a of an extension arm 234.

In the embodiment, the fixing plate 232b is screwed to a center of the flat plate 232a. By moving an action position of a reactive force applied to the main body 232 by a heat conductive structure 210 to a central part of the flat plate 232a, the impact on the bonding between the main body 232 and the adhesive layer 220 is reduced. Certainly, the fixing plate 232b may also be disposed at other parts of the flat plate 232a as long as the main body 232 is able to be glued to the circuit board 10 more stably.

Figure 3A:
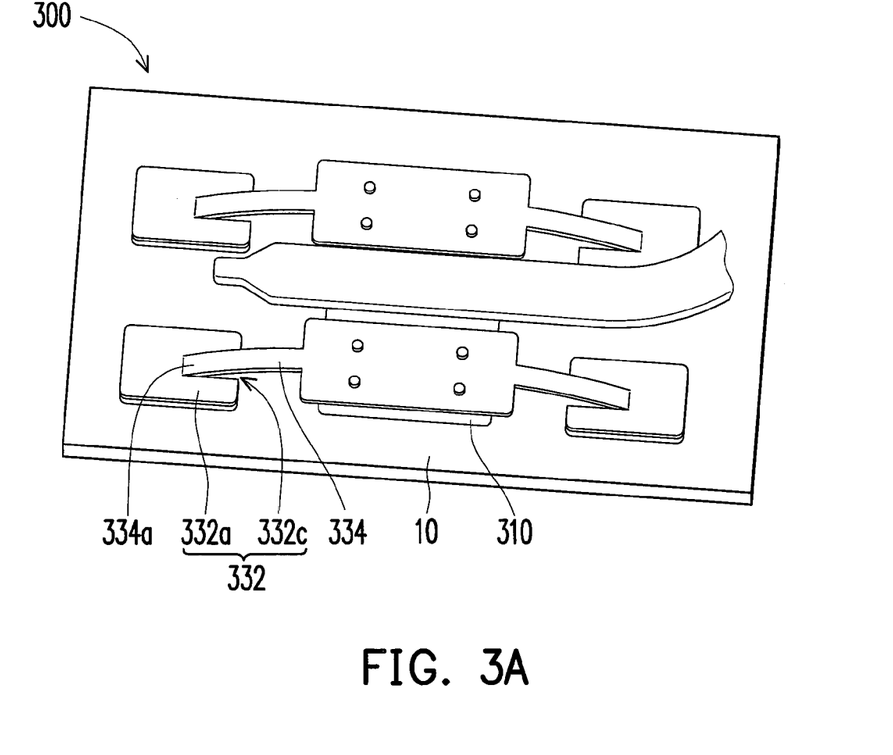
FIG. 3A is a perspective view of a thermal dissipating module disposed on a circuit board according to a third embodiment of the invention.
Figure 3B:
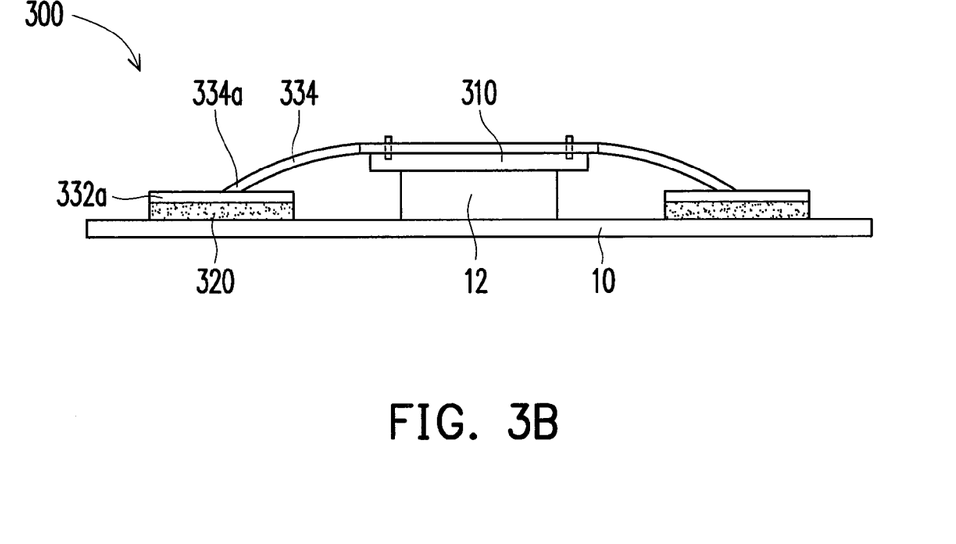
FIG. 3B is a front view of the thermal dissipating module disposed on the circuit board in FIG. 3A.

FIG. 3A is a perspective view of a thermal dissipating module disposed on a circuit board according to a third embodiment of the invention. FIG. 3B is a front view of the thermal dissipating module disposed on the circuit board in FIG. 3A. Please refer to FIGS. 3A and 3B. A main body 332 of a thermal dissipating module 300 includes a flat plate 332a. The flat plate 332a has a recess 332c, and a first end part 334a of an extension arm 334 is connected to a part of the flat plate 332a near a bottom of the recess 332c. In the embodiment, the first end part 334a and the part of the flat plate 332a near the bottom of the recess 332c are integrally formed. Moreover, a length of the recess 332c is about half of a length of the flat plate 332a so that a position where a reactive force from a heat conductive structure 310 is applied to the flat plate 332a is near a central part of the flat plate 332a, and therefore the main body 332 is able to be glued to the circuit board 10 more stably. Certainly, a position of the recess 332c at the flat plate 332a and a size of the recess 332c are not limited thereto.

Figure 4A:
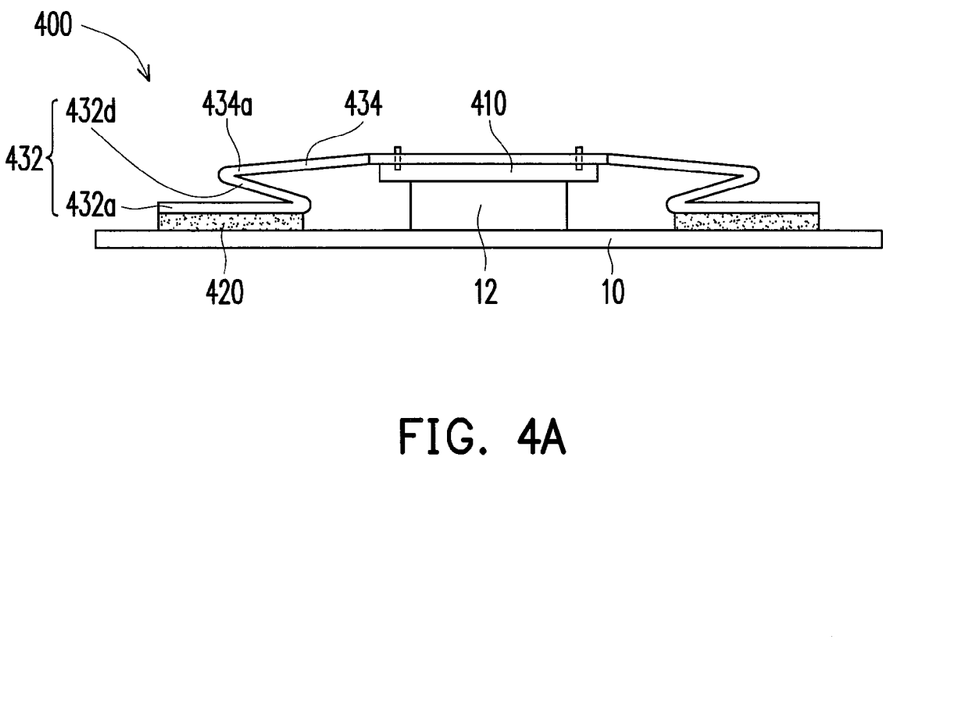
FIG. 4A is a front view of a thermal dissipating module disposed on a circuit board according to a fourth embodiment of the invention.
Figure 4B:
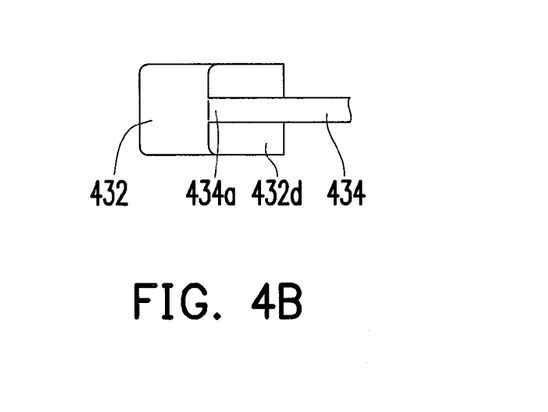
FIG. 4B is a top view of the thermal dissipating module in FIG. 4A.

FIG. 4A is a front view of a thermal dissipating module disposed on a circuit board according to a fourth embodiment of the invention. FIG. 4B is a top view of the thermal dissipating module in FIG. 4A. Please refer to FIGS. 4A and 4B. A main body 432 of a thermal dissipating module 400 includes a flat plate 432a and a bending part 432d which is a bended end of the flat plate 432a. The flat plate 432a is glued to the circuit board 10 by an adhesive layer 420, and the bending part 432d is connected to a first end part 434a of a extension arm 434. A projection position of a part at which the bending part 432d connects to the first end part 434a projected to the flat plate 432a may be near a central part of the flat plate 432a so as for the main body 432 to be located at the central part of the flat plate 432a when the a heat conductive structure 410 applies a reactive force to the main body 432. Therefore, a better adhesiveness between the main body 432 and the adhesive layer 420 may be maintained. The bending part 432d further has a function of providing an elastic force to a thermal dissipating module 400 so as to avoid the heating element 12 to be damaged due to an exceeding normal force brought after the thermal dissipating module 400 is secured on the heating element 12.

Figure 5A:
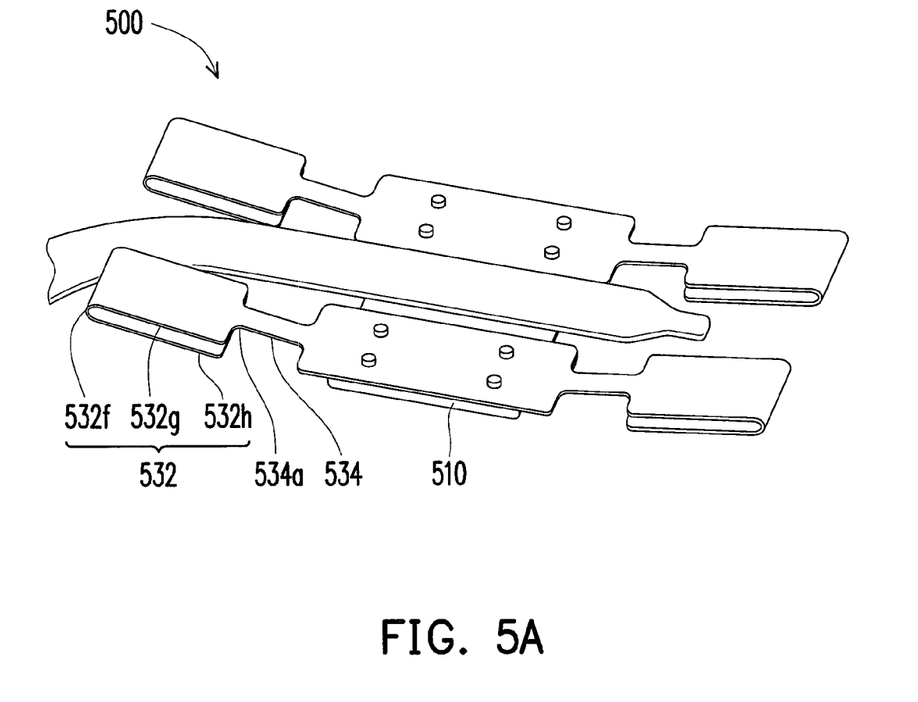
FIG. 5A is a perspective view of a thermal dissipating module according to a fifth embodiment of the invention.
Figure 5B:
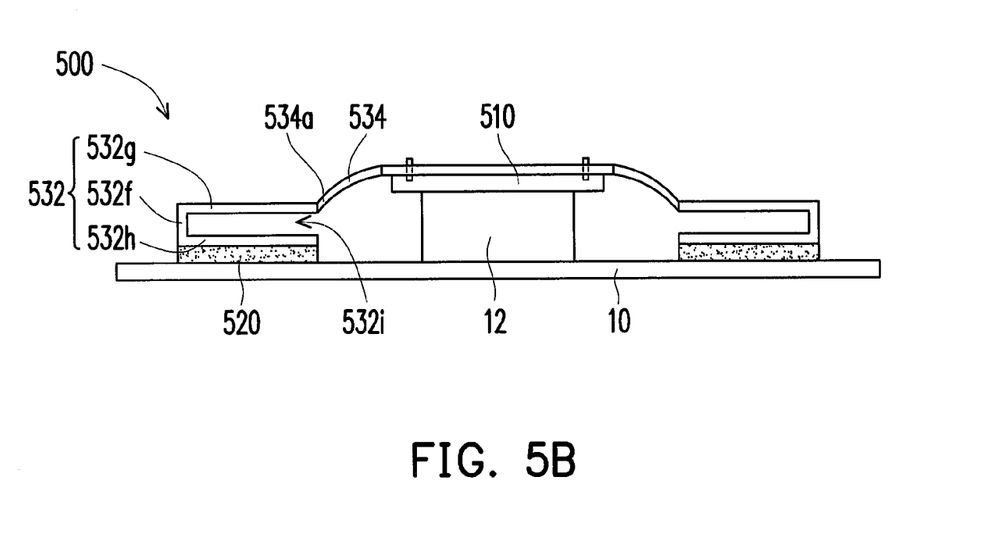
FIG. 5B is a front view of the thermal dissipating module disposed on the circuit board in FIG. 5A.

FIG. 5A is a perspective view of a thermal dissipating module according to a fifth embodiment of the invention. FIG. 5B is a front view of the thermal dissipating module disposed on the circuit board in FIG. 5A. Please refer to FIGS. 5A and 5B. A main body 532 of a thermal dissipating module 500 is in a C shape. The main body 532 includes a side plate 532f, an upper plate 532b, and a lower plate 532h. The upper plate 532g and the lower plate 532h are respectively located at two ends of the side plate 532f. The lower plate 532h is glued to the circuit board 10 by the adhesive layer 520, and the upper plate 532g is connected to a first end part 534a of an extension arm 534. In the embodiment, an opening 532i of the main body 532 is toward the heating element 12, and the extension arm 534 and the main body 532 are integrally formed. However, an opening direction of the opening 532i of the main body 532 and a connecting method of the extension arm 534 to the main body 532 are not limited thereto. Since the main body 532 is connected to the extension arm 534 through the upper plate 532g, a reactive force applied by a heat conductive structure 510 focuses on the upper plate 532g. Also, since the main body 532 serves as a cushion, thereby reducing an impact of the reactive force applied by the heat conductive structure 510 on the lower plate 532h. Therefore, a better bonding between the lower plate 532h and the adhesive layer 520 may be obtained.

Figure 6A:
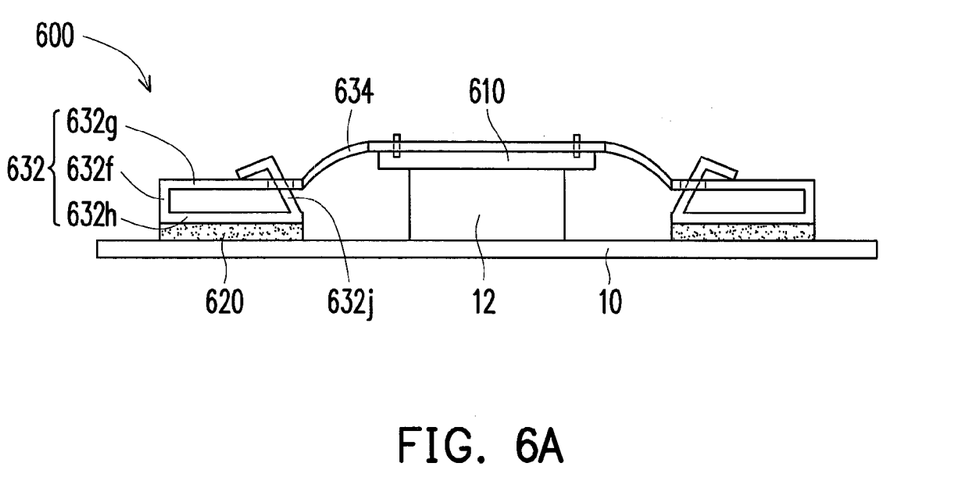
FIG. 6A is a front view of a thermal dissipating module disposed on a circuit board according to a sixth embodiment of the invention.
Figure 6B:
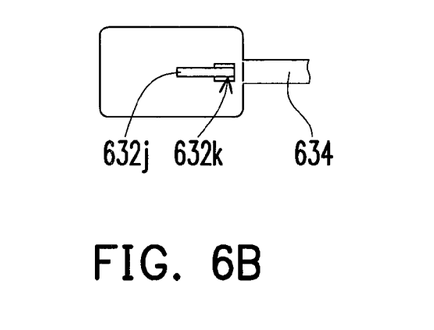
FIG. 6B is a top view of the thermal dissipating module in FIG. 6A.

FIG. 6A is a front view of a thermal dissipating module disposed on a circuit board according to a sixth embodiment of the invention. FIG. 6B is a top view of the thermal dissipating module in FIG. 6A. Please refer to FIGS. 6A and 6B. A major difference between a thermal dissipating module 600 in FIG. 6A and a thermal dissipating module 500 in FIG. 5A lies in that a lower plate 632h of the thermal dissipating module 600 in FIG. 6A includes a clip hook 632j and an upper plate 632g includes an aperture 632k. The clip hook 632j is through the aperture 632k and secured on the upper plate 632g. In the embodiment, the clip hook 632j and a side plate 632f are respectively located on two relative sides of the lower plate 632h so that two corresponding sides of the lower plate 632h and the upper plate 632g are joined together by the side plate 632f and the clip hook 632j respectively to maintain a relative position of the lower plate 632h and the upper plate 632g. Moreover, a sufficient heat dissipating effect is ensured through applying more force which is toward the heating element 12 to a heat conductive structure 610 by an extension arm 634. A reactive force applied by the heat conductive structure 610 in the embodiment also focuses on the upper plate 632g so that a better bonding between the lower plate 632h and the adhesive layer 620 may be obtained.

Figure 7:
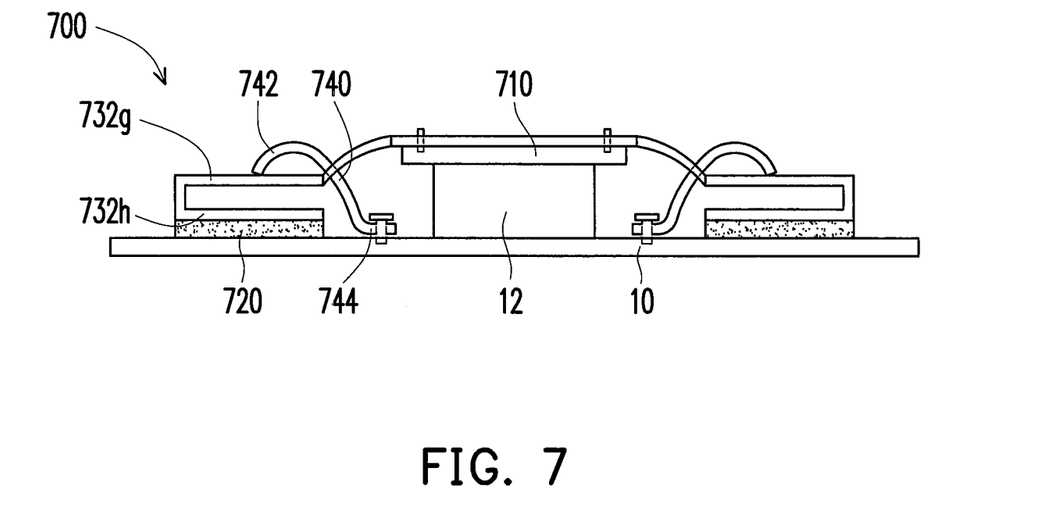
FIG. 7 is a front view of a thermal dissipating module disposed on a circuit board according to a seventh embodiment of the invention.

FIG. 7 is a front view of a thermal dissipating module disposed on a circuit board according to a seventh embodiment of the invention. Please refer to FIG. 7. A major difference between a thermal dissipating module 700 in FIG. 7 and the thermal dissipating module 500 in FIG. 5A lies in that a main body 732 of the thermal dissipating module 700 in FIG. 7 further includes a hook arm 740. The hook arm 740 includes a first end 742 and a second end 744. The first end 742 of the hook arm 740 is connected to an upper plate 732g, and the second end 744 of the hook arm 740 is connected to the circuit board 10. In the embodiment, the first end 742 of the hook arm 740 is fastened through the upper plate 732g, and the second end 744 of the hook arm 740 is screwed to the circuit board 10. However, a fixing method of the first end 742 and the second end 744 is not limited thereto. Moreover, the hook arm 740 and a side plate are respectively located on two relative sides of the upper plate 732g and the lower plate 732h to maintain a relative position of the lower plate 732h and the upper plate 732g so that an extension arm 734 may provide more force which is toward the heating element 12 to a heat conductive structure 710. A reactive force applied by the heat conductive structure 710 in the embodiment focuses on the upper plate 732g so that a better bonding between the lower plate 732h and the adhesive layer 720 may be obtained.

Figure 8A:
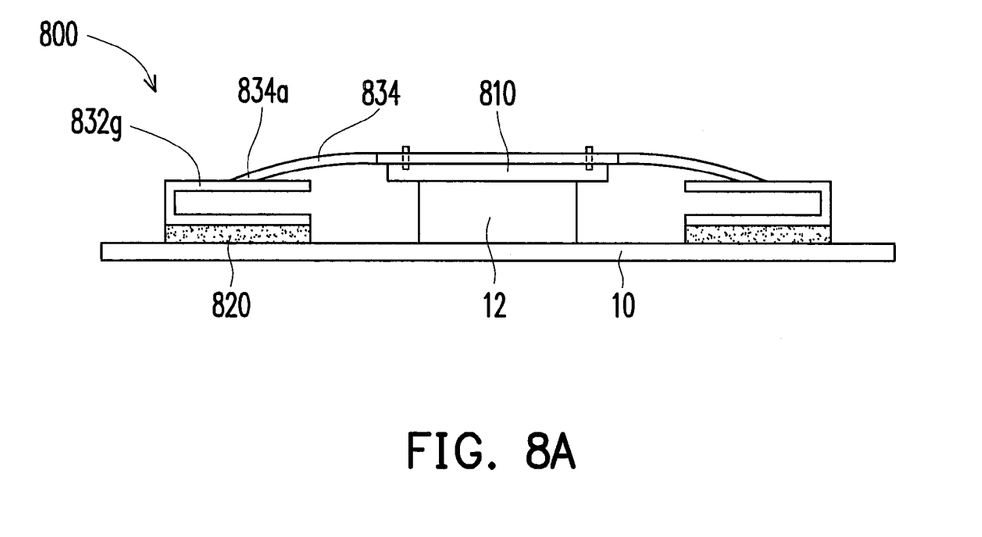
FIG. 8A is a front view of a thermal dissipating module disposed on a circuit board according to an eighth embodiment of the invention.
Figure 8B:
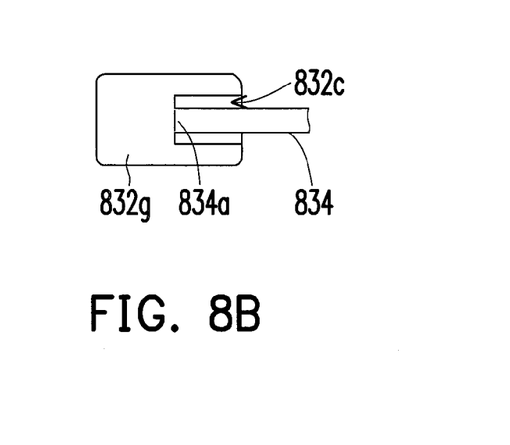
FIG. 8B is a top view of the thermal dissipating module in FIG. 8A.

FIG. 8A is a front view of a thermal dissipating module disposed on a circuit board according to an eighth embodiment of the invention. FIG. 8B is a top view of the thermal dissipating module in FIG. 8A. Please refer to FIGS. 8A and 8B. A major difference between a thermal dissipating module 800 in FIG. 8A and the thermal dissipating module 500 in FIG. 5A lies in that an upper plate 832g of the thermal dissipating module 800 in FIG. 8A has a recess 832c, and a first end part 834a of an extension arm 834 is connected to a position at the upper plate 832g near the recess 832c. In the embodiment, the first end part 834a and a part on the upper plate 832g near a bottom of the recess 832c are integrally formed. Furthermore, a length of the recess 832c is about half of a length of the upper plate 832g so that a position where a reactive force from a heat conductive structure 810 is applied to the upper plate 832g is near a central part of the upper plate 832g, and therefore the main body 832 is able to be glued to the circuit board 10 more stably. Certainly, a part where the recess 832c is located on the upper plate 832g and a size of the recess 832c are not limited thereto. In addition, in FIG. 8B, although a width of the extension arm 834 is narrower than a width of the recess 832c, the extension arm 834 may also be at the same width as that of the recess 832c.

Figure 9A:
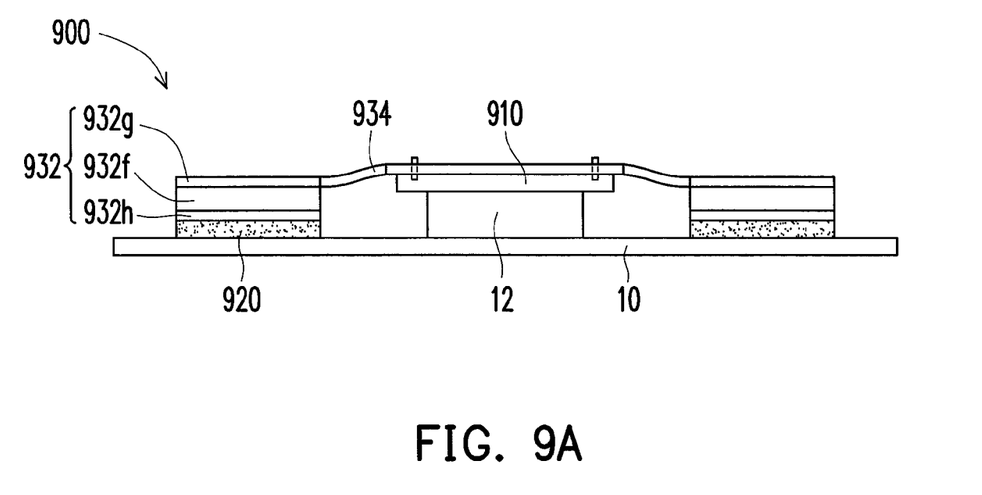
FIG. 9A is a front view of a thermal dissipating module disposed on a circuit board according to a ninth embodiment of the invention.
Figure 9B:
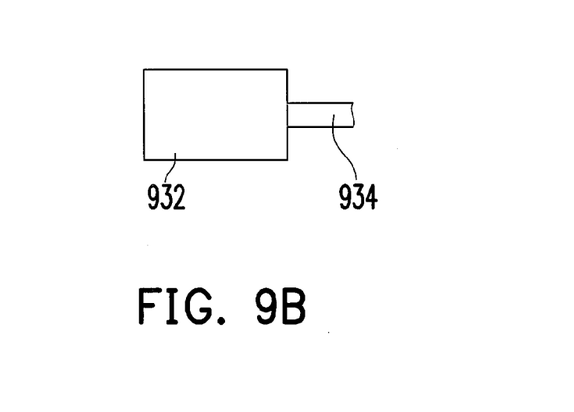
FIG. 9B is a top view of the thermal dissipating module in FIG. 9A.
Figure 9C:
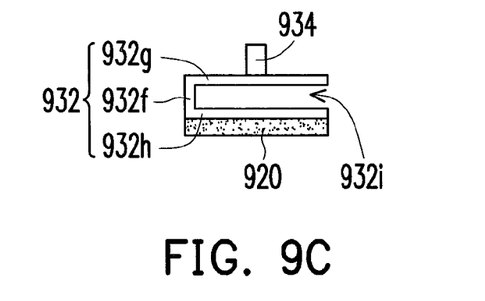
FIG. 9C is a left side view of the thermal dissipating module in FIG. 9A.
Figure 9D:
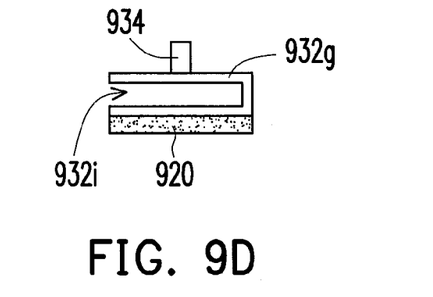
FIGS. 9D-9F are left side views of a thermal dissipating module according to other embodiments.
Figure 9E:
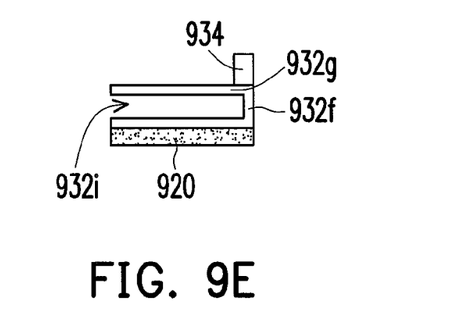
Figure 9F:
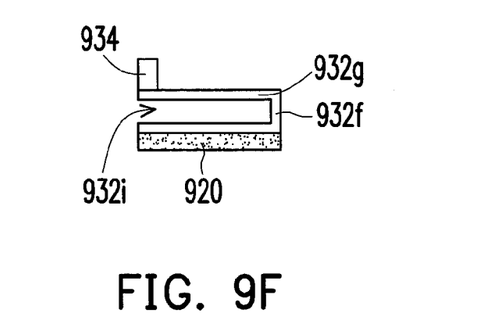

FIG. 9A is a front view of a thermal dissipating module disposed on a circuit board according to a ninth embodiment of the invention. FIG. 9B is a top view of the thermal dissipating module in FIG. 9A. FIG. 9C is a left side view of the thermal dissipating module in FIG. 9A. Please refer to FIGS. 9A-9C. A major difference between a thermal dissipating module 900 in FIG. 9A and the thermal dissipating module 500 in FIG. 5A lies in that a projection of an opening direction of an opening 932i of a main body 932 in FIG. 9A projected on the circuit board 10 is orthogonal to a projection of an extension arm 934 projected on the circuit board 10. That is, the opening direction of the opening 932i of the main body 932 is not toward the heating element 12. Furthermore, the thermal dissipating module 900 in the embodiment is also connected to the extension arm 934 through an upper plate 932g. Therefore, a reactive force applied by a heat conductive structure 910 focuses on the upper plate 932g so that a better bonding between a lower plate 932h and an adhesive layer 920 may be obtained. The extension arm 934 may be connected to a position at the upper plate 932g as shown in FIG. 9C and also be connected to the upper plate 932g near a central part on a left side surface in an direction emitted from an opening 932i. Apart from that, as shown in FIG. 9D, the extension arm 934 may also be connected to the upper plate 932g near a central part on a right side surface in the direction emitted from the opening 932i. Alternatively, as shown in FIG. 9E or FIG. 9F, the extension arm 934 may be connected to the upper plate 932g near or away from a part of a side plate 932f on the right side surface in the direction emitted from the opening 932i. Certainly, a relative position of the extension arm 934 and the upper plate 932g are not limited thereto.

In summary, the invention allows the elastic member to be glued to the circuit board by the adhesive layer and the heat conductive structure is secured by the elastic member, which simplifies the assembling process of the thermal dissipating module. In addition, the invention does not require holes to be perforated on the circuit board to secure the thermal dissipating module. Therefore, the number of holes perforated on the circuit board may be reduced so that the design of the circuit board may be more flexible. In addition, the reactive force from the heat conductive structure applied to the elastic member may be reduced with a variety of shape designs of the elastic member thereby increasing the bonding between the elastic member and the adhesive layer. Moreover, when the certain degree of force is applied to the main body, the main body is able to be detached from the adhesive layer so that it is easier to disassemble the thermal dissipating module.

Although the invention has been disclosed by the above embodiments, the embodiments are not intended to limit the invention. It will be apparent to those skilled in the art that various modifications and variations can be made to the structure of the invention without departing from the scope or spirit of the invention. Therefore, the protecting range of the invention falls in the appended claims.

What is claimed is:

1. A thermal dissipating module, suitable for removing heat from a heating element disposed on a circuit board, comprising:
a heat conductive structure suitable for being disposed on the heating element,
an adhesive layer suitable for being disposed on the circuit board and adjacent to the heating element, wherein the adhesive layer does not fall off the circuit board easily when applying a normal force, and the adhesive layer falls off the circuit board when applying a shear force, and
an elastic member glued to the circuit board by the adhesive layer and applying a force to the heat conductive structure by the elastic member to attach the heat conductive structure to the heating element.

2. The thermal dissipating module according to claim 1, wherein the elastic member comprises a main body and an extension arm, the main body is suitable for being glued to the circuit board by the adhesive layer, the extension min having a first end part and a second end part, the first end part connected to the main body, and the second end part secured on the heat conductive structure.

3. The thermal dissipating module according to claim 2, wherein the main body and the extension arm are integrally formed.

4. The thermal dissipating module according to claim 2, wherein the second end part of the extension arm is screwed to the heat conductive structure.

5. The thermal dissipating module according to claim 2, wherein the main body comprises a flat plate and a fixing plate, the flat plate suitable for being glued to the circuit board by the adhesive layer, and the fixing plate screwed to the flat plate and connected to the first end part of the extension arm.

6. The thermal dissipating module according to claim 2, wherein the main body comprises a flat plate, the flat plate having a recess, and the first end part of the extension arm connected to a part of the flat plate near a bottom of the recess.

7. The thermal dissipating module according to claim 2, wherein the main body comprises a flat plate and a bending part which is bended end of the flat plate, the flat plate glued to the circuit board by the adhesive layer, and the bending part connected to the first end part of the extension arm.

8. The thermal dissipating module according to claim 2, wherein the main body is in a C shape, the main body comprising a side plate, an upper plate, and a lower plate, the upper plate and the lower plate respectively located on two ends of the side plate, the lower plate glued to the circuit board by the adhesive layer, and the upper plate connected to the first end part of the extension arm.

9. The thermal dissipating module according to claim 8, wherein the lower plate comprises a clip hook, the upper plate comprising an aperture, and the clip hook being through the aperture and secured on the upper plate.

10. The thermal dissipating module according to claim 8, wherein the main body further comprises a hook arm comprising a first end and a second end, the first end of the hook arm connected to the upper plate, and the second end of the hook arm connected to the circuit board.

11. The thermal dissipating module according to claim 8, wherein the upper plate has a recess, and the first end part of the extension arm is connected to a position on the upper plate near the recess.

12. The thermal dissipating module according to claim 8, wherein an opening of the main body is toward the heating element.

13. The thermal dissipating module according to claim 8, wherein a projection of an opening direction of the main body projected on the circuit board is orthogonal to a projection of the extension arm on the circuit board.

14. The thermal dissipating module according to claim 1, wherein a force is capable of being applied to the elastic member for the elastic member to be detached from the adhesive layer.

15. The thermal dissipating module according to claim 1, wherein the force is a force toward the heating element provided by the heat conductive structure.

* * * * *